US009899124B2

United States Patent
Grinwald et al.

(10) Patent No.: US 9,899,124 B2
(45) Date of Patent: Feb. 20, 2018

(54) ELECTROSTATIC INK COMPOSITIONS

(75) Inventors: Yaron Grinwald, Meitar (IL); Gideon Amir, Ness Ziona (IL); Rita Reznikov, Ashdod (IL); Reut Avigdor, Modiin (IL); Haim Gefen, Beit Dagan (IL); Gil Bar-Haim, Holon (IL); Mark Sandler, Rehovot (IL); Dror Kella, Nes Ziona (IL)

(73) Assignee: Hewlett-Packard Indigo B.V., Amstelveen (NL)

( * ) Notice: Subject to any disclaimer, the term of this patent is extended or adjusted under 35 U.S.C. 154(b) by 99 days.

(21) Appl. No.: 14/416,453

(22) PCT Filed: Jul. 23, 2012

(86) PCT No.: PCT/EP2012/064429
§ 371 (c)(1),
(2), (4) Date: Apr. 15, 2015

(87) PCT Pub. No.: WO2014/015890
PCT Pub. Date: Jan. 30, 2014

(65) Prior Publication Data
US 2015/0220010 A1    Aug. 6, 2015

(51) Int. Cl.
*H01B 1/24* (2006.01)
*H05K 1/09* (2006.01)
(Continued)

(52) U.S. Cl.
CPC .............. *H01B 1/24* (2013.01); *B05D 5/12* (2013.01); *C09D 7/1291* (2013.01);
(Continued)

(58) Field of Classification Search
CPC ... H01B 1/20; H01B 1/22; H01B 1/24; H05K 1/09; H05K 1/092; H05K 1/095;
(Continued)

(56) References Cited

U.S. PATENT DOCUMENTS

| 4,504,138 A | 3/1985 | Kuehnle et al. |
| 4,690,539 A | 9/1987 | Radulski et al. |

(Continued)

FOREIGN PATENT DOCUMENTS

| CN | 101765643 | 6/2010 |
| JP | S60135956 | 7/1985 |

(Continued)

OTHER PUBLICATIONS

DuPont Packaging & Industrial Polymers, DuPontTM, Bynel® 2022, Bynell® resins Product Data Sheet issued Aug. 1, 2010, pp. 1-4.
(Continued)

*Primary Examiner* — Harold Pyon
*Assistant Examiner* — Matthew R Diaz
(74) *Attorney, Agent, or Firm* — HP Inc. Patent Department

(57) ABSTRACT

The present disclosure is drawn to an electrostatic ink composition comprising a resin and an elongate conductive species. Also disclosed herein is a substrate on which is electrostatically printed a conductive trace, wherein the trace comprises a resin and an elongate conductive species. Further disclosed herein is a method of electrophotographic printing an electrostatic ink composition comprising a resin and an elongate conductive species.

15 Claims, 2 Drawing Sheets

(51) Int. Cl.
  *B05D 5/12*     (2006.01)
  *G03G 9/08*     (2006.01)
  *G03G 9/087*    (2006.01)
  *C09D 7/12*     (2006.01)
  *C09D 11/106*   (2014.01)
  *C09D 11/037*   (2014.01)
  *C09D 11/52*    (2014.01)

(52) U.S. Cl.
  CPC .......... *C09D 11/037* (2013.01); *C09D 11/106* (2013.01); *C09D 11/52* (2013.01); *G03G 9/0827* (2013.01); *G03G 9/08704* (2013.01); *G03G 9/08733* (2013.01); *H05K 1/09* (2013.01); *H05K 2201/0158* (2013.01); *H05K 2201/0323* (2013.01)

(58) Field of Classification Search
  CPC ...... H05K 1/097; G03G 9/0827; G03G 9/087; G03G 9/08702; G03G 9/08704; G03G 9/08726; G03G 9/08733; C09D 5/24; C09D 11/03; C09D 11/037; C09D 11/10; C09D 11/101; C09D 11/102; C09D 11/103; C09D 11/104; C09D 11/105; C09D 11/106; C09D 11/324; C09D 11/36; C09D 11/52; B05D 5/12
  See application file for complete search history.

(56) References Cited

U.S. PATENT DOCUMENTS

| | | | |
|---|---|---|---|
| 5,192,638 A | 3/1993 | Landa et al. | |
| 6,070,042 A | 5/2000 | Landa et al. | |
| 6,333,016 B1 | 12/2001 | Resasco et al. | |
| 6,337,168 B1 | 1/2002 | Almog | |
| 6,623,902 B1 | 9/2003 | Ben Avraham et al. | |
| 7,001,538 B2 * | 2/2006 | Lee | H01B 1/24 252/511 |
| 7,060,241 B2 | 6/2006 | Glatkowski | |
| 7,141,185 B2 * | 11/2006 | Conaghan | C09D 11/30 252/511 |
| 7,285,198 B2 | 10/2007 | Douglas | |
| 7,294,372 B2 | 11/2007 | Cok | |
| 7,413,684 B2 * | 8/2008 | Fishburn | H01B 1/24 252/500 |
| 7,645,497 B2 * | 1/2010 | Spath | B82Y 10/00 345/173 |
| 7,901,595 B2 * | 3/2011 | Vilkman | C08F 283/00 252/511 |
| 7,977,023 B2 * | 7/2011 | Roditi | C09D 11/107 430/114 |
| 8,127,440 B2 | 3/2012 | Douglas | |
| 2001/0033985 A1 | 10/2001 | Fonash et al. | |
| 2006/0093937 A1 | 5/2006 | Grinwald | |
| 2006/0108567 A1 * | 5/2006 | Charati | C08K 3/04 252/500 |
| 2006/0222985 A1 | 10/2006 | Tsubuko et al. | |
| 2007/0235697 A1 * | 10/2007 | Borade | C08L 71/12 252/511 |
| 2009/0029273 A1 | 1/2009 | Roditi et al. | |
| 2009/0068241 A1 | 3/2009 | Britz et al. | |
| 2010/0072431 A1 * | 3/2010 | Vergelati | H01B 1/24 252/511 |
| 2010/0122642 A1 | 5/2010 | Farrugia et al. | |
| 2011/0086206 A1 * | 4/2011 | Scheffer | C09D 5/24 428/195.1 |
| 2011/0133134 A1 * | 6/2011 | Varma | C08L 23/0853 252/511 |
| 2011/0217650 A1 * | 9/2011 | Mor | C09D 11/03 430/115 |
| 2012/0097903 A1 * | 4/2012 | Scheffer | H01B 1/24 252/511 |
| 2013/0140499 A1 * | 6/2013 | Yue | C08L 23/0853 252/511 |
| 2013/0295308 A1 * | 11/2013 | Kumazawa | C08L 77/06 428/36.9 |

FOREIGN PATENT DOCUMENTS

| | | |
|---|---|---|
| JP | H07181715 | 7/1995 |
| JP | 2003280249 | 10/2003 |
| JP | 2007078899 | 3/2007 |
| JP | 2010122685 | 6/2010 |
| JP | 2011008162 | 1/2011 |
| JP | 2011027820 | 2/2011 |
| WO | WO 01/92381 | 12/2001 |
| WO | WO 2004/067647 | 8/2004 |
| WO | WO 2007/130069 | 11/2007 |
| WO | WO2011016172 | 2/2011 |
| WO | WO2011019970 | 2/2011 |
| WO | WO2012091002 | 7/2012 |
| WO | WO 2012098840 A1 * | 7/2012 ............ C08L 77/06 |

OTHER PUBLICATIONS

DuPont Packaging & Industrial Polymers, DuPontTM, Nucrel® 699, Nucrel® resins Product Data Sheet issued Aug. 1, 2010, pp. 1-3.
DuPont Packaging & Industrial Polymers, DuPontTM, Nucrel® 925, Nucrel® resins Product Data Sheet issued Aug. 1, 2010, pp. 1-3.
DuPont Packaging & Industrial Polymers, DuPontTM, Nucrel® 960, Nucrel® resins Product Data Sheet issued Feb. 16, 2011, pp. 1-3.
DuPont Packaging & Industrial Polymers, Nucrel® resins, DuPontTM, Nucrel® 2806, issued Apr. 2006, 3 pages.
Honeywell, A-C® 580, Ethylene-Acrylic Acid Copolymer, issued Jan. 2008, 1 page.
Honeywell, Material Safety Data Sheet, A-C® 5120, 50 kg, D, issued Jan. 20, 2009, pp. 1-9.
Honeywell, Material Safety Data Sheet, A-C® Ethylene-Maleic Anhydride Copolymers, issued Feb. 2004, pp. 1-8.
Honeywell, Safety Data Sheet, A-C® 540; 540A; 580; 5120; 5180; OS-540; OS-580, issued Apr. 14, 2011, pp. 1-8.
J. Chem. Phys., vol. 104, No. 5, Feb. 1, 1996, Abstract, 1 page.

\* cited by examiner

ELECTROSTATIC INK COMPOSITIONS

BACKGROUND

In electrostatic printing systems, it is common practice to develop a hardcopy of an image by using a photoconductive surface. The photoconductive surface is typically on a cylinder and is often termed a photo imaging plate (PIP). The photoconductive surface is selectively charged with a latent electrostatic image having image and background areas with different potentials. For example, an electrostatic ink composition comprising charged toner particles in a carrier liquid can be brought into contact with the selectively charged photoconductive surface. The charged toner particles adhere to the image areas of the latent image while the background areas remain clean. The image is then transferred to a print substrate (e.g. paper) directly or, more commonly, by being first transferred to an intermediate transfer member, which can be a soft swelling blanket, and then to the print substrate. Variations of this method utilize different ways for forming the electrostatic latent image on a photoreceptor or on a dielectric material.

DETAILED DESCRIPTION

Figure 1:
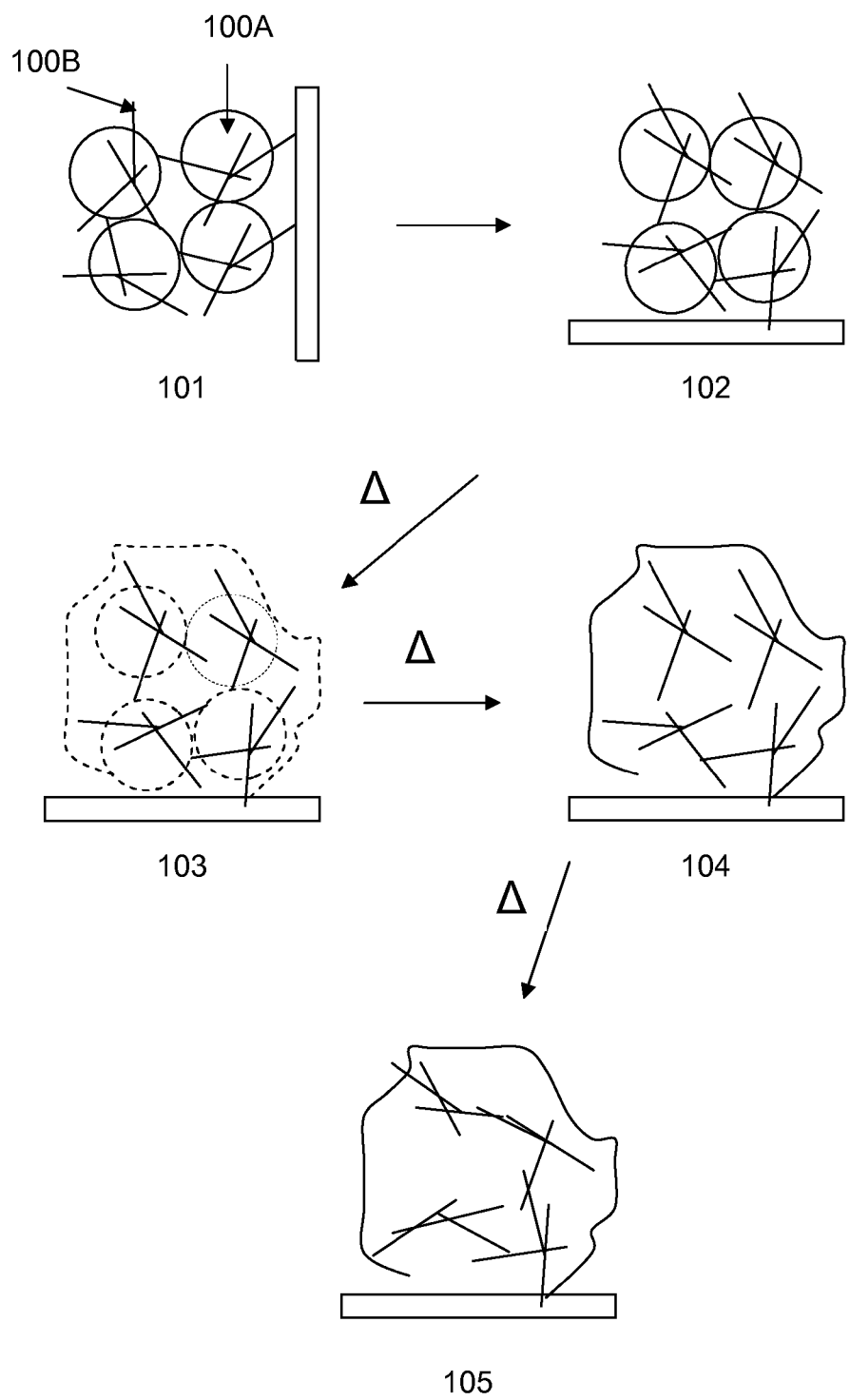
FIG. 1 shows a schematic illustration of an example method to create a conductive trace using Liquid Electrophotographic Printing (LEP), starting from randomly-dispersed elongate conductive species within resin particles on a photoimaging plate (101), to aligned elongate conductive species on a substrate (105).

Before examples of the present invention are disclosed and described, it is to be understood that this invention is not limited to the particular process steps and materials disclosed herein because such process steps and materials may vary somewhat. It is also to be understood that the terminology used herein is used for the purpose of describing particular examples only. The terms are not intended to be limiting because the scope of the present invention is intended to be limited only by the appended claims and equivalents thereof.

It is noted that, as used in this specification and the appended claims, the singular forms "a," "an," and "the" include plural referents unless the context clearly dictates otherwise. Equally, as used in this specification and the appended claims, plural forms include single referents unless the context clearly dictates otherwise.

As used herein, "carrier liquid," "carrier," or "carrier vehicle" refers to the fluid in which the polymers, particles, colorant, charge directors and other additives can be dispersed to form a liquid electrostatic ink or electrophotographic ink. Such carrier liquids and vehicle components are known in the art. Typical carrier liquids can include a mixture of a variety of different agents, such as surfactants, co-solvents, viscosity modifiers, and/or other possible ingredients.

As used herein, "electrostatic ink composition" generally refers to a ink composition in a form that is suitable for use in an electrostatic printing process, sometimes termed an electrophotographic printing process. In some examples an electrostatic ink composition comprises chargeable particles, sometimes termed toner particles that can be moved in a potential gradient. In some examples, the ink composition may be in dry powder form, which is sometimes termed a dry or powder toner. In some examples, the ink composition may be in liquid form, e.g. having toner particles dispersed in a carrier liquid; this is sometimes termed a liquid toner.

As used herein, "colorant" includes pigments and dyes.

As used herein, "pigment" generally includes pigment colorants, magnetic particles, aluminas, silicas, and/or other ceramics or organo-metallics, whether or not such particulates impart color. Thus, though the present description primarily exemplifies the use of pigment colorants, the term "pigment" can be used more generally to describe not only pigment colorants, but other pigments such as organometallics, ferrites, ceramics, etc.

As used herein, "co-polymer" refers to a polymer that is polymerized from at least two monomers.

As used herein, "melt flow rate" generally refers to the extrusion rate of a resin through an orifice of defined dimensions at a specified temperature and load, usually reported as temperature/load, e.g. 190° C./2.16 kg. Flow rates can be used to differentiate grades or provide a measure of degradation of a material as a result of molding. In the present disclosure, "melt flow rate" is measured per ASTM D1238-04c Standard Test Method for Melt Flow Rates of Thermoplastics by Extrusion Plastometer, as known in the art. If a melt flow rate of a particular polymer is specified, unless otherwise stated, it is the melt flow rate for that polymer alone, in the absence of any of the other components of the electrostatic ink composition.

As used herein, "acidity," "acid number," or "acid value" refers to the mass of potassium hydroxide (KOH) in milligrams that is required to neutralize one gram of a substance. The acidity of a polymer can be measured according to standard techniques, for example as described in ASTM D1386. If the acidity of a particular polymer is specified, unless otherwise stated, it is the acidity for that polymer alone, in the absence of any of the other components of the electrostatic ink composition.

As used herein, "melt viscosity" generally refers to the ratio of shear stress to shear rate at a given shear stress or shear rate. Testing is generally performed using a capillary rheometer. A plastic charge is heated in the rheometer barrel and is forced through a die with a plunger. The plunger is pushed either by a constant force or at constant rate depending on the equipment. Measurements are taken once the system has reached steady-state operation. One method used is measuring Brookfield viscosity @140° C., units are mPa-s or cPoise, as known in the art. Alternatively, the melt viscosity can be measured using a rheometer, e.g. a commercially available AR-2000 Rheometer from Thermal Analysis Instruments, using the geometry of: 25 mm steel plate-standard steel parallel plate, and finding the plate over plate rheometry isotherm at 120° C., 0.01 hz shear rate. If the melt viscosity of a particular polymer is specified, unless otherwise stated, it is the melt viscosity for that polymer alone, in the absence of any of the other components of the electrostatic ink composition.

A certain monomer may be described herein as constituting a certain weight percentage of a polymer. This indicates that the repeating units formed from the said monomer in the polymer constitute said weight percentage of the polymer.

As used herein, "incompatible wax" refers to a wax that is incompatible with the resin. Specifically, the wax phase separates from the resin upon the cooling of the resin fused mixture on a substrate during and after the transfer of the ink film from a heated intermediate transfer member.

As used herein, "electrostatic(ally) printing" or "electrophotographic(ally) printing" generally refers to the process that provides an image that is transferred from a photo imaging substrate either directly or indirectly via an intermediate transfer member to another substrate, e.g. a print substrate. As such, the image is not substantially absorbed into the photo imaging substrate on which it is applied. Additionally, "electrophotographic printers" or "electrostatic printers" generally refer to those printers capable of performing electrophotographic printing or electrostatic printing, as described above. "Liquid electrophotographic printing" is a specific type of electrophotographic printing where a liquid ink is employed in the electrophotographic process rather than a powder toner.

As used herein, the term "about" is used to provide flexibility to a numerical range endpoint by providing that a given value may be "a little above" or "a little below" the endpoint. The degree of flexibility of this term can be dictated by the particular variable and would be within the knowledge of those skilled in the art to determine based on experience and the associated description herein.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 wt % to about 5 wt %" should be interpreted to include not only the explicitly recited values of about 1 wt % to about 5 wt %, but also include individual values and subranges within the indicated range. Thus, included in this numerical range are individual values such as 2, 3.5, and 4 and sub-ranges such as from 1-3, from 2-4, and from 3-5, etc. This same principle applies to ranges reciting only one numerical value. Furthermore, such an interpretation should apply regardless of the breadth of the range or the characteristics being described.

In a first aspect, there is provided an electrostatic ink composition comprising a resin and an elongate conductive species.

In a second aspect, there is provided a substrate on which is electrostatically printed a conductive trace, wherein the trace comprises a resin and an elongate conductive species.

In a third aspect, there is provided a method of electrophotographic printing an electrostatic ink composition, wherein the electrostatic ink composition comprises particles comprising a resin and an elongate conductive species, and the method comprises:

forming a latent electrostatic image on a surface;

contacting the surface with the electrostatic ink composition, such that at least some of the particles adhere to the surface to form a developed toner image on the surface, and transferring the toner image to a substrate. Further, the method can involve passing the electrostatic composition between a stationary electrode and a rotating member, which is a member having the surface having a latent electrostatic image thereon or a member in contact with the surface having a latent electrostatic image thereon.

A conductive species, in the present application, indicates an electrically conductive species. The elongate conductive species may be a species comprising any electrically conductive material. In some examples, the conductive species comprises a material selected from a metal or carbon. The metal may be a metal in elemental form or an alloy of two or more metals. The conductive pigment may comprise a metal selected from aluminium, tin, a transition metal, and alloys of any one or more thereof. The transition metal may be selected from, for example, zinc, copper, silver, gold, nickel, palladium, platinum, and iron. Alloys that may be used include, but are not limited to, brass, bronze, steel and chromium.

In some examples, the elongate conductive species comprises a species selected from carbon nanotubes, carbon black, graphene and metals, and mixtures thereof. In some examples, the elongate conductive species comprises carbon nanotubes. Carbon nanotubes have been found to be particularly effective in the present application, owning to their very low symmetry, high aspect ratio, and ability to convert from a randomised distribution when dispersed in polymeric particles to interconnected conductive lines when printed (e.g. when the resin has fused).

In some examples, the electrostatic ink composition and/or conductive trace comprises chargeable particles comprising the resin and the elongate species. In some examples, the chargeable particles are dispersed in a carrier liquid.

In some examples, the electrostatic ink composition and/or conductive trace may further comprise a charge director.

The resin of any of the examples can comprise a polymer having acidic side groups. In some examples, the resin comprises a co-polymer of an alkylene monomer and a monomer selected from acrylic acid and methacrylic acid.

In some examples, the resin comprises (i) a polymer having acidic side groups and (ii) a polymer formed from a maleic anhydride monomer. In some examples, the resin can comprise (i) a polymer having acidic side groups and (ii) a co-polymer of an alkylene monomer and a maleic anhydride monomer. A polymer formed from maleic anhydride has been found to have a reasonable ability to encapsulate the elongate conductive species, particularly those of typically high aspect ratio, such as carbon nanotubes. A polymer having acidic side groups has been found to have a reasonable ability in maintaining a charge when in an electrostatic ink composition, e.g. before and during printing. The combination of a polymer having acidic side groups and a polymer formed from maleic anhydride in the resin has been found to have a suitable balance of being able to encapsulate the conductive species, and be reasonably stable when bearing a charge, e.g. when a charge director is present and used in an electrostatic printing process.

In some examples, the resin comprises (i) a co-polymer of an alkylene monomer and a monomer selected from acrylic acid and methacrylic acid and (ii) a co-polymer of an alkylene monomer and a maleic anhydride. In some examples, the resin comprises (i) a co-polymer of an alkylene monomer, which is selected from ethylene and propylene, and a monomer selected from acrylic acid and methacrylic acid and (ii) a co-polymer of an alkylene monomer, which is selected from ethylene and propylene, and a maleic anhydride. In some examples, polymer (ii) is or comprises a co-polymer of ethylene or propylene (e.g. 70 wt % to 99.9 wt %) and maleic anhydride (e.g. 0.1 wt % to 30 wt %). Examples of polymer (i) are described in more detail below, and any of which can be combined with polymer (ii). Polymer (ii) may have an acidity of 50 mg KOH/g or less, in some examples an acidity of 40 mg KOH/g or less, in some examples acidity of 35 mg KOH/g or less. Polymer (ii) may be obtained commercially, e.g. A-C ethylene maleic anhydride polymers available from Honeywell, e.g. AC-573A, AC-573P, AC-575A, AC-575P and 1287P. Polymer (i) and/or polymer (ii) may be further combined with a polymer having ester side groups. Examples of polymers having ester side groups are described below.

The weight:weight ratio of polymer (i): polymer (ii) described above may be from 10:1 to 1:10, in some examples 5:1 to 1:5; in some examples 5:1 to 1:1; in some examples 4:1 to 1:1; in some examples 3:1 to 1:1, in some examples 2.5:1 to 2:1, in some examples about 2:1.

In some examples, the resin comprises polymer (i) and polymer (ii) as described above, and polymer (i) has a hardness, as measured at 25° C. using ASTM D2240, that is more than polymer (ii), and in some examples the hardness of polymer (i), as measured at 25° C. using ASTM D2240, is at least 1.2 times that of polymer (ii), in some examples at least 1.4 times that of polymer (ii), in some examples at least 1.5 times that of polymer (ii), in some examples at least 1.7 times that of polymer (ii). In some examples, the resin comprises a co-polymer of an alkylene monomer and a monomer selected from acrylic acid and methacrylic acid, and a co-polymer of an alkylene monomer and maleic anhydride, wherein the co-polymer of an alkylene monomer and a monomer selected from acrylic acid and methacrylic acid has a hardness, as measured at 25° C. using ASTM D2240, that is more than the co-polymer of an alkylene monomer and maleic anhydride, and in some examples the co-polymer of an alkylene monomer and a monomer selected from acrylic acid and methacrylic acid has a hardness at least 1.2 times that of the co-polymer of an alkylene monomer and maleic anhydride, in some examples at least 1.4 times that of the co-polymer of an alkylene monomer and maleic anhydride, in some examples at least 1.5 times that of the co-polymer of an alkylene monomer and maleic anhydride, in some examples at least 1.7 times that of the co-polymer of an alkylene monomer and maleic anhydride. The ASTM D2240 test may be a test that uses a durometer of a type selected from any of A, C, D, B, M, E, O, OO, DO, OOO, OOO-S and R.

In some examples, the resin comprises polymer (i) and polymer (ii) as described above, and polymer (ii) has a melt viscosity, as measured at 140° C., that is more than polymer (i), in some examples polymer (ii) has a melt viscosity, as measured at 140° C., at least 1.5 times that of polymer (i), in some examples at least 2 times that of polymer (i), in some examples at least 3 times that of polymer (i), in some examples at least 4 times that of polymer (i), in some examples at least 5 times that of polymer (i), in some examples at least 6 times that of polymer (i).

In some examples, the resin comprises a co-polymer of an alkylene monomer and a monomer selected from acrylic acid and methacrylic acid, and a co-polymer of an alkylene monomer and maleic anhydride, wherein the co-polymer of an alkylene monomer and maleic anhydride has a melt viscosity, as measured at 140 ° C., that is more than the co-polymer of an alkylene monomer and a monomer selected from acrylic acid and methacrylic acid, and in some examples, the co-polymer of an alkylene monomer and maleic anhydride has a melt viscosity, as measured at 140° C., that is at least 2 times that of the co-polymer of an alkylene monomer and a monomer selected from acrylic acid and methacrylic acid, in some examples at least 3 times that of the co-polymer of an alkylene monomer and a monomer selected from acrylic acid and methacrylic acid, in some examples at least 4 times that of the co-polymer of an alkylene monomer and a monomer selected from acrylic acid and methacrylic acid, in some examples at least 5 times that of the co-polymer of an alkylene monomer and a monomer selected from acrylic acid and methacrylic acid, in some examples at least 6 times that of the co-polymer of an alkylene monomer and a monomer selected from acrylic acid and methacrylic acid. The melt viscosity may be measured as described herein, for example, the melt viscosity may be the Brookfield viscosity @140° C.

In some examples, the resin can comprise a thermoplastic resin comprising a polymer having an acidic side group.

In some examples, the elongate conductive species comprises a species selected from carbon nanotubes, carbon black, graphene and metals (for example, Al and Ag), or mixtures thereof.

The present inventors have found that species with low symmetry, e.g. elongate species, particularly those with typically high aspect ratios such as carbon nanotubes, are effective when used in electrostatic printing of conductive traces. In an electrostatic ink composition that comprises resin-containing particles in which the elongate species are encapsulated (partially or completely), the distribution of elongate species is typically randomised. This may be due to the production of the resin particles containing the elongate species. In an electrostatic printing process, in which the resin particles can be subjected to high potential gradients, the randomised distribution has been found to lower the propensity of the elongate species to form conductive paths through the particles. This minimises electrical discharge through the resin particles. However, the present inventors have found that when resin particles are fused, which may be by the application of heat, this can result in alignment and interconnection of the elongate species, thus increasing their ability to conduct through the resin, e.g. when printed on a substrate.

In some examples, the electrostatic ink composition is used for printing conductive traces on a substrate using Liquid Electro-Photography. In some examples, the conductive trace is printed using Liquid Electro-Photography. In some example, said printing will comprise electrostatic printing.

An elongate species may be a species having a first dimension that is longer that each of a second dimension and a third dimension, wherein the first, second and third dimensions are perpendicular to one another. In some examples, the elongate conductive species is rod-shaped. In some examples, the elongate conductive species may have an aspect ratio between 2 and 2000. As described herein, aspect ratio may be defined as the ratio of the length of the longest dimension of an elongate conductive species (e.g. the first dimension described above) to the length of the next-to-longest dimension (e.g. the second or third dimension described above), wherein the dimensions are perpendicular to one another. The elongate conductive species may have an aspect ratio at least 2, in some examples at least 3, in some examples at least 4, in some examples at least 5, in some examples at least 6, in some examples at least 7, in some examples at least 8, in some examples at least 9, in some examples at least 10, in some examples at least 11, in some examples at least 12, in some examples at least 13, in some examples at least 14, in some examples at least 15, in some examples at least 16, in some examples at least 17, in some examples at least 18, in some examples at least 19, in some examples at least 20.

The elongate conductive species may have an aspect ratio of at least 25, in some examples at least 25, in some examples at least 30, in some examples at least 40, in some examples at least 50, in some examples at least 60, in some examples at least 70, in some examples at least 80, in some examples at least 90, in some examples at least 100, in some examples at least 150, in some examples at least 200, in some examples at least 300, in some examples at least 400, in some examples at least 500, in some examples at least 1000 in some examples at least 1500, in some examples at least 2000.

In some examples, the elongate conductive species may have an aspect ratio less than 50, for example less than 45, for example less than 40, for example less than 35, for example less than 30, for example less than 25, for example less than 20, for example less than 10, for example less than 9, for example less than 8, for example less than 7, for example less than 6, for example less than 5, for example less than 4, for example less than 3, for example less than 2.

The elongate conductive species may be present in the electrostatic ink composition and/or conductive trace in an amount of from about 0.001 wt % to about 30 wt % of the solids content (of the electrostatic ink composition), 1 wt % to about 25 wt % of the solids content, in some examples in an amount of from about 5 wt % to about 25 wt % of the solids content, in some examples in an amount of from about 5 wt % to about 20 wt % of the solids content, in some examples about 5 wt % to about 15 wt % of the solids content.

The elongate conductive species may be present in the electrostatic ink composition and/or conductive trace in an amount of at least about 0.001 wt % of the solids content (of the electrostatic ink composition), for example in an amount of at least about 0.01 wt % of the solids content, for example in an amount of at least about 0.1 wt % of the solids content, for example in an amount of at least about 0.5 wt % of the solids content, for example in an amount of at least about 1 wt % of the solids content, for example in an amount of at least about 2 wt % of the solids content, for example in an amount of at least about 3 wt % of the solids content, for example in an amount of at least about 5 wt % of the solids content, for example in an amount of at least about 7 wt % of the solids content, for example in an amount of at least about 10 wt % of the solids content, for example in an amount of at least about 15 wt % of the solids content.

The elongate conductive species may be present in the electrostatic ink composition and/or conductive trace in an amount of 30 wt % or less of the solids content (of the electrostatic ink composition), in some examples in an amount 25 wt % or less of the solids content, in some examples in an amount 20 wt % or less of the solids content, in some examples in an amount 15 wt % or less of the solids content, in some examples in an amount 10 wt % or less of the solids content, in some examples in an amount 5 wt % or less of the solids content.

As described herein, the elongate conductive species may comprise or be carbon nanotubes. Carbon nanotubes have been described in various publications and can have a conventional meaning herein. Various types of carbon nanotubes are described, for example, in U.S. Pat. No. 6,333,016, which is incorporated herein by reference in its entirety. J. Chem. Phys., Vol. 104, No. 5, 1 Feb. 1996 also describes carbon nanotubes of various types, for example straight walled and bent nanotubes, and this document is incorporated herein by reference in its entirety.

The carbon nanotubes may be selected from straight and bent multi-walled nanotubes (MWNTs), straight and bent double-walled nanotubes (DWNTs), and straight and bent single-walled nanotubes (SWNTs), and various compositions of these nanotube forms and common by-products contained in nanotube preparations, such as described in U.S. Pat. No. 6,333,016 and WO 01/92381, which are incorporated herein by reference in their entirety.

The carbon nanotubes, e.g. single walled carbon nanotubes, may have an outer diameter of 4 nm or less, in some examples 3.5 nm or less, in some examples 3.25 nm or less, in some examples 3.0 nm or less. The carbon nanotubes may have an outer diameter of about 0.5 to about 2.5 nm, in some examples an outer diameter of about 0.5 to about 2.0 nm, in some examples an outer diameter of about 0.5 to about 1.5 nm. The carbon nanotubes may have an outer diameter of about 0.5 to about 1.0 nm.

In some examples, e.g. in multiwalled nanotubes, the carbon nanotubes have an outer diameter of 2 nm or more, in some examples 3 nm or more, in some examples 5 nm or more, in some examples 10 nm or more, in some examples 15 nm or more. In some examples, e.g. in multiwalled nanotubes, the carbon nanotubes have an outer diameter of 2 nm to 50 nm.

In some examples, the carbon nanotubes comprise single walled carbon-based SWNT-containing material. SWNTs can be formed by a number of techniques, such as laser ablation of a carbon target, decomposing a hydrocarbon, and setting up an arc between two graphite electrodes.

In some examples, the electrostatic ink composition of the invention is in the form of a dry toner. In some examples, the electrostatic ink composition of the invention is in the form of a liquid toner.

In some examples, the electrostatic ink composition and/or conductive trace of the invention can comprise additives, for example an additive selected from a carrier liquid, a colorant, a charge director, a charge adjuvant, a wax, a surfactant, biocides, organic solvents, viscosity modifiers, materials for pH adjustment, sequestering agents, preservatives, compatibility additives, emulsifiers and the like. The wax may be an incompatible wax.

In some examples, the electrostatic ink composition comprises a carrier liquid. In some examples, particles comprising the resin and elongate conductive species are suspended or dispersed in the carrier liquid. In the particles, the resin may encapsulate, partially or completely, the elongate conductive species. Generally, the carrier liquid can act as a dispersing medium for the other components in the electrostatic ink. For example, the carrier liquid can comprise or be a hydrocarbon, silicone oil, vegetable oil, etc. The carrier liquid can include, but is not limited to, an insulating, non-polar, non-aqueous liquid that is used as the medium for toner particles. The carrier liquid can include compounds that have a resistivity in excess of about $10^9$ ohm-cm. The carrier liquid may have a dielectric constant below about 5, in some examples below about 3. The carrier liquid can include, but is not limited to, hydrocarbons. The hydrocarbon can include, but is not limited to, an aliphatic hydrocarbon, an isomerized aliphatic hydrocarbon, branched chain aliphatic hydrocarbons, aromatic hydrocarbons, and combinations thereof. Examples of the carrier liquids include, but are not limited to, aliphatic hydrocarbons, isoparaffinic compounds, paraffinic compounds, dearomatized hydrocarbon compounds, and the like. In particular, the carrier liquids can include, but are not limited to, Isopar-G™, Isopar-H™, Isopar-L™, Isopar-M™, Isopar-K™, Isopar-V™, Norpar 12™, Norpar 13™, Norpar 15™, Exxol D40™, Exxol D80™, Exxol D100™, Exxol D130™, and Exxol140™ (each sold by EXXON CORPORATION); Teclen N-16™, Teclen N-20™, Teclen N-22™, Nisseki Naphthesol L™, Nisseki Naphthesol M™, Nisseki Naphthesol H™, #0 Solvent L™, #0 Solvent M™, #0 Solvent H™, Nisseki Isosol 300™, Nisseki Isosol 400™, AF-4™, AF-5™, AF-6™ and AF-7™ (each sold by NIPPON OIL CORPORATION); IP Solvent 1620™ and IP Solvent 2028™ (each sold by IDEMITSU PETROCHEMICAL CO., LTD.); Amsco OMS™ and Amsco 460™ (each sold by AMERICAN MINERAL SPIRITS CORP.); and Electron, Positron, New II, Purogen HF (100% synthetic terpenes) (sold by ECOLINK™). The carrier liquids and other components of the present disclosure are described in U.S. Pat. Nos. 6,337,168, 6,070,042, and 5,192,638.

The carrier liquid can constitute about 20% to 99.5% by weight of the electrostatic ink composition, in some examples 50% to 99.5% by weight of the electrostatic ink composition. The carrier liquid may constitute about 40 to 90% by weight of the electrostatic ink composition. The carrier liquid may constitute about 60% to 80% by weight of the electrostatic ink composition. The carrier liquid may constitute about 90% to 99.5% by weight of the electrostatic ink composition, in some examples 95% to 99% by weight of the electrostatic ink composition.

The conductive trace may be substantially free from carrier liquid. In an electrostatic printing process and/or afterwards, the carrier liquid may be removed, e.g. by an electrophoresis processes during printing and/or evaporation, such that substantially only solids are transferred to a substrate, e.g. the final substrate or print substrate. Substantially free from carrier liquid may indicate that the conductive trace contains less than 5 wt % carrier liquid, in some examples, less than 2 wt % carrier liquid, in some examples less than 1 wt % carrier liquid, in some examples less than 0.5 wt% carrier liquid. In some examples the conductive trace is free from carrier liquid.

The resin in the electrostatic ink composition and/or conductive trace can comprise a polymer including, but not limited to, a thermoplastic polymer. A thermoplastic polymer is sometimes referred to as a thermoplastic resin. In some examples, the polymer may be selected from ethylene or propylene acrylic acid co-polymers; ethylene or propylene methacrylic acid co-polymers; ethylene vinyl acetate co-polymers; co-polymers of ethylene or propylene (e.g. 80 wt % to 99.9 wt %), and alkyl (e.g. C1 to C5) ester of methacrylic or acrylic acid (e.g. 0.1 wt % to 20 wt %); co-polymers of ethylene (e.g. 80 wt % to 99.9 wt %), acrylic or methacrylic acid (e.g. 0.1 wt % to 20.0 wt %) and alkyl (e.g. C1 to C5) ester of methacrylic or acrylic acid (e.g. 0.1 wt % to 20 wt %); co-polymers of ethylene or propylene (e.g. 70 wt % to 99.9 wt %) and maleic anhydride (e.g. 0.1 wt % to 30 wt %); polyethylene; polystyrene; isotactic polypropylene (crystalline); co-polymers of ethylene ethyl acrylate; polyesters; polyvinyl toluene; polyamides; styrene/butadiene co-polymers; epoxy resins; acrylic resins (e.g. co-polymer of acrylic or methacrylic acid and at least one alkyl ester of acrylic or methacrylic acid wherein alkyl may have from 1 to about 20 carbon atoms, such as methyl methacrylate (e.g. 50% to 90%)/methacrylic acid (e.g. 0 wt % to 20 wt %)/ethylhexylacrylate (e.g. 10 wt % to 50 wt %)); ethylene-acrylate terpolymers: ethylene-acrylic esters-maleic anhydride (MAH) or glycidyl methacrylate (GMA) terpolymers; ethylene-acrylic acid ionomers and combinations thereof.

The polymer may be a polymer having acidic side groups, which may be as described above as polymer (i), and may be combined with a polymer formed from maleic anhydride, which was denoted as polymer (ii) above.

Examples of the polymer having acidic side groups will now be described. The polymer having acidic side groups may have an acidity of 50 mg KOH/g or more, in some examples an acidity of 60 mg KOH/g or more, in some examples an acidity of 70 mg KOH/g or more, in some examples an acidity of 80 mg KOH/g or more, in some examples an acidity of 90 mg KOH/g or more, in some examples an acidity of 100 mg KOH/g or more, in some examples an acidity of 105 mg KOH/g or more, in some examples 110 mg KOH/g or more, in some examples 115 mg KOH/g or more. The polymer having acidic side groups may have an acidity of 200 mg KOH/g or less, in some examples 190 mg or less, in some examples 180 mg or less, in some examples 130 mg KOH/g or less, in some examples 120 mg KOH/g or less. Acidity of a polymer, as measured in mg KOH/g can be measured using standard procedures known in the art, for example using the procedure described in ASTM D1386.

The resin may comprise a polymer, in some examples a polymer having acidic side groups, that has a melt flow rate of less than about 70 g/10 minutes, in some examples about 60 g/10 minutes or less, in some examples about 50 g/10 minutes or less, in some examples about 40 g/10 minutes or less, in some examples 30 g/10 minutes or less, in some examples 20 g/10 minutes or less, in some examples 10 g/10 minutes or less. In some examples, all polymers having acidic side groups and/or ester groups in the particles each individually have a melt flow rate of less than 90 g/10 minutes, 80 g/10 minutes or less, in some examples 80 g/10 minutes or less, in some examples 70 g/10 minutes or less, in some examples 70 g/10 minutes or less, in some examples 60 g/10 minutes or less.

The polymer having acidic side groups can have a melt flow rate of about 10 g/10 minutes to about 120 g/10 minutes, in some examples about 10 g/10 minutes to about 70 g/10 minutes, in some examples about 10 g/10 minutes to 40 g/10 minutes, in some examples 20 g/10 minutes to 30 g/10 minutes. The polymer having acidic side groups can have a melt flow rate of, in some examples, about 50 g/10 minutes to about 120 g/10 minutes, in some examples 60 g/10 minutes to about 100 g/10 minutes. The melt flow rate can be measured using standard procedures known in the art, for example as described in ASTM D1238.

The acidic side groups may be in free acid form or may be in the form of an anion and associated with one or more counterions, typically metal counterions, e.g. a metal selected from the alkali metals, such as lithium, sodium and potassium, alkali earth metals, such as magnesium or calcium, and transition metals, such as zinc. The polymer having acidic sides groups can be selected from resins such as co-polymers of ethylene and an ethylenically unsaturated acid of either acrylic acid or methacrylic acid; and ionomers thereof, such as methacrylic acid and ethylene-acrylic or methacrylic acid co-polymers which are at least partially neutralized with metal ions (e.g. Zn, Na, Li) such as SUR- LYN® ionomers. The polymer comprising acidic side groups can be a co-polymer of ethylene and an ethylenically unsaturated acid of either acrylic or methacrylic acid, where the ethylenically unsaturated acid of either acrylic or methacrylic acid constitute from 5 wt % to about 25 wt % of the co-polymer, in some examples from 10 wt % to about 20 wt % of the co-polymer.

The resin may comprise two different polymers having acidic side groups. The two polymers having acidic side groups may have different acidities, which may fall within the ranges mentioned above. The resin may comprise a first polymer having acidic side groups that has an acidity of from 10 mg KOH/g to 110 mg KOH/g, in some examples 20 mg KOH/g to 110 mg KOH/g, in some examples 30 mg KOH/g to 110 mg KOH/g, in some examples 50 mg KOH/g to 110 mg KOH/g, and a second polymer having acidic side groups that has an acidity of 110 mg KOH/g to 130 mg KOH/g.

The resin may comprise two different polymers having acidic side groups: a first polymer having acidic side groups that has a melt flow rate of about 10 g/10 minutes to about 50 g/10 minutes and an acidity of from 10 mg KOH/g to 110 mg KOH/g, in some examples 20 mg KOH/g to 110 mg KOH/g, in some examples 30 mg KOH/g to 110 mg KOH/g, in some examples 50 mg KOH/g to 110 mg KOH/g, and a second polymer having acidic side groups that has a melt flow rate of about 50 g/10 minutes to about 120 g/10 minutes and an acidity of 110 mg KOH/g to 130 mg KOH/g. The first and second polymers may be absent of ester groups.

The ratio of the first polymer having acidic side groups to the second polymer having acidic side groups can be from about 10:1 to about 2:1. The ratio can be from about 6:1 to about 3:1, in some examples about 4:1.

The resin may comprise a polymer having a melt viscosity of 15000 poise or less, in some examples a melt viscosity of 10000 poise or less, in some examples 1000 poise or less, in some examples 100 poise or less, in some examples 50 poise or less, in some examples 10 poise or less; said polymer may be a polymer having acidic side groups as described herein. The resin may comprise a first polymer having a melt viscosity of 15000 poise or more, in some examples 20000 poise or more, in some examples 50000 poise or more, in some examples 70000 poise or more; and in some examples, the resin may comprise a second polymer having a melt viscosity less than the first polymer, in some examples a melt viscosity of 15000 poise or less, in some examples a melt viscosity of 10000 poise or less, in some examples 1000 poise or less, in some examples 100 poise or less, in some examples 50 poise or less, in some examples 10 poise or less. The resin may comprise a first polymer having a melt viscosity of more than 60000 poise, in some examples from 60000 poise to 100000 poise, in some examples from 65000 poise to 85000 poise; a second polymer having a melt viscosity of from 15000 poise to 40000 poise, in some examples 20000 poise to 30000 poise, and a third polymer having a melt viscosity of 15000 poise or less, in some examples a melt viscosity of 10000 poise or less, in some examples 1000 poise or less, in some examples 100 poise or less, in some examples 50 poise or less, in some examples 10 poise or less; an example of the first polymer is Nucrel 960 (from DuPont), and example of the second polymer is Nucrel 699 (from DuPont), and an example of the third polymer is AC-5120 or AC-5180 (from Honeywell). The first, second and third polymers may be polymers having acidic side groups as described herein. The melt viscosity can be measured using a rheometer, e.g. a commercially available AR-2000 Rheometer from Thermal Analysis Instruments, using the geometry of: 25 mm steel plate-standard steel parallel plate, and finding the plate over plate rheometry isotherm at 120° C., 0.01 hz shear rate.

If the resin in the invention comprises a single type of polymer, the polymer (excluding any other components of the electrostatic ink composition) may have a melt viscosity of 6000 poise or more, in some examples a melt viscosity of 8000 poise or more, in some examples a melt viscosity of 10000 poise or more, in some examples a melt viscosity of 12000 poise or more. If the resin comprises a plurality of polymers all the polymers of the resin may together form a mixture (excluding any other components of the electrostatic ink composition) that has a melt viscosity of 6000 poise or more, in some examples a melt viscosity of 8000 poise or more, in some examples a melt viscosity of 10000 poise or more, in some examples a melt viscosity of 12000 poise or more. Melt viscosity can be measured using standard techniques. The melt viscosity can be measured using a rheometer, e.g. a commercially available AR-2000 Rheometer from Thermal Analysis Instruments, using the geometry of: 25 mm steel plate-standard steel parallel plate, and finding the plate over plate rheometry isotherm at 120° C., 0.01 hz shear rate.

The resin in the invention may comprise two different polymers having acidic side groups that are selected from co-polymers of ethylene and an ethylenically unsaturated acid of either acrylic acid; and ionomers thereof, such as methacrylic acid and ethylene-acrylic or methacrylic acid co-polymers which are at least partially neutralized with metal ions (e.g. Zn, Na, Li) such as SURLYN® ionomers. The resin may comprise (i) a first polymer that is a co-polymer of ethylene and an ethylenically unsaturated acid of either acrylic acid and methacrylic acid, wherein the ethylenically unsaturated acid of either acrylic or methacrylic acid constitutes from 8 wt % to about 16 wt % of the co-polymer, in some examples 10 wt % to 16 wt % of the co-polymer; and (ii) a second polymer that is a co-polymer of ethylene and an ethylenically unsaturated acid of either acrylic acid and methacrylic acid, wherein the ethylenically unsaturated acid of either acrylic or methacrylic acid constitutes from 12 wt % to about 30 wt % of the co-polymer, in some examples from 14 wt % to about 20 wt % of the co-polymer, in some examples from 16 wt % to about 20 wt % of the co-polymer in some examples from 17 wt % to 19 wt % of the co-polymer.

The resin of the invention may comprise a polymer having acidic side groups, as described above (which is preferably free of ester side groups), and a polymer having ester side groups. The polymer having ester side groups is preferably a thermoplastic polymer. The polymer having ester side groups may further comprise acidic side groups. The polymer having ester side groups may be a co-polymer of a monomer having ester side groups and a monomer having acidic side groups. The polymer may be a co-polymer of a monomer having ester side groups, a monomer having acidic side groups, and a monomer absent of any acidic and ester side groups. The monomer having ester side groups may be a monomer selected from esterified acrylic acid or esterified methacrylic acid. The monomer having acidic side groups may be a monomer selected from acrylic or methacrylic acid. The monomer absent of any acidic and ester side groups may be an alkylene monomer, including, but not limited to, ethylene or propylene. The esterified acrylic acid or esterified methacrylic acid may, respectively, be an alkyl ester of acrylic acid or an alkyl ester of methacrylic acid. The alkyl group in the alkyl ester of acrylic or methacrylic acid may be an alkyl group having 1 to 30 carbons, in some examples 1 to 20 carbons, in some examples 1 to 10 carbons; in some examples selected from methyl, ethyl, iso-propyl, n-propyl, t-butyl, iso-butyl, n-butyl and pentyl.

The polymer having ester side groups may be a co-polymer of a first monomer having ester side groups, a second monomer having acidic side groups and a third monomer which is an alkylene monomer absent of any acidic and ester side groups. The polymer having ester side groups may be a co-polymer of (i) a first monomer having ester side groups selected from esterified acrylic acid or esterified methacrylic acid, in some examples an alkyl ester of acrylic or methacrylic acid, (ii) a second monomer having acidic side groups selected from acrylic or methacrylic acid and (iii) a third monomer which is an alkylene monomer selected from ethylene and propylene. The first monomer may constitute 1% to 50% by weight of the co-polymer, in some examples 5% to 40% by weight, in some examples 5% to 20% by weight of the co-polymer, in some examples 5% to 15% by weight of the co-polymer. The second monomer may constitute 1% to 50% by weight of the co-polymer, in some examples 5% to 40% by weight of the co-polymer, in some examples 5% to 20% by weight of the co-polymer, in some examples 5% to 15% by weight of the co-polymer. The first monomer can constitute 5% to 40% by weight of the co-polymer, the second monomer constitutes 5% to 40% by weight of the co-polymer, and with the third monomer constituting the remaining weight of the co-polymer. In some examples, the first monomer constitutes 5% to 15% by weight of the co-polymer, the second monomer constitutes 5% to 15% by weight of the co-polymer, with the third monomer constituting the remaining weight of the co-polymer. In some examples, the first monomer constitutes 8% to 12% by weight of the co-polymer, the second monomer constitutes 8% to 12% by weight of the co-polymer, with the third monomer constituting the remaining weight of the co-polymer. In some examples, the first monomer constitutes about 10% by weight of the co-polymer, the second monomer constitutes about 10% by weight of the co-polymer, and with the third monomer constituting the remaining weight of the co-polymer. The polymer may be selected from the Bynel® class of monomer, including Bynel 2022 and Bynel 2002, which are available from DuPont®.

The polymer having ester side groups may constitute 1% or more by weight of the total amount of the polymers of in the electrostatic ink composition and/or conductive trace, e.g. the total amount of the polymer or polymers having acidic side groups and polymer having ester side groups. The polymer having ester side groups may constitute 5% or more by weight of the total amount of the polymers in the particles, in some examples 8% or more by weight of the total amount of the polymers in the particles, in some examples 10% or more by weight of the total amount of the polymers in the particles, in some examples 15% or more by weight of the total amount of the polymers in the electrostatic ink composition and/or conductive trace, in some examples 20% or more by weight of the total amount of the polymers in the electrostatic ink composition and/or conductive trace, in some examples 25% or more by weight of the total amount of the polymers in the electrostatic ink composition and/or conductive trace, in some examples 30% or more by weight of the total amount of the polymers in the electrostatic ink composition and/or conductive trace, in some examples 35% or more by weight of the total amount of the polymers in the electrostatic ink composition and/or conductive trace. The polymer having ester side groups may constitute from 5% to 50% by weight of the total amount of the polymers in the electrostatic ink composition and/or conductive trace, in some examples 10% to 40% by weight of the total amount of the polymers in the electrostatic ink composition and/or conductive trace, in some examples 15% to 30% by weight of the total amount of the polymers in the electrostatic ink composition and/or conductive trace.

The polymer having ester side groups may have an acidity of 50 mg KOH/g or more, in some examples an acidity of 60 mg KOH/g or more, in some examples an acidity of 70 mg KOH/g or more, in some examples an acidity of 80 mg KOH/g or more. The polymer having ester side groups may have an acidity of 100 mg KOH/g or less, in some examples 90 mg KOH/g or less. The polymer having ester side groups may have an acidity of 60 mg KOH/g to 90 mg KOH/g, in some examples 70 mg KOH/g to 80 mg KOH/g.

The polymer having ester side groups may have a melt flow rate of about 10 g/10 minutes to about 120 g/10 minutes, in some examples about 10 g/10 minutes to about 50 g/10 minutes, in some examples about 20 g/10 minutes to about 40 g/10 minutes, in some examples about 25 g/10 minutes to about 35 g/10 minutes.

The polymer, polymers, co-polymer or co-polymers can in some examples be selected from the Nucrel family of toners (e.g. Nucrel 403™, Nucrel 407™, Nucrel 609HS™, Nucrel 908HS™, Nucrel 1202HC™, Nucrel 30707™, Nucrel 1214™, Nucrel 903™, Nucrel 3990™, Nucrel 910™, Nucrel 925™, Nucrel 699™, Nucrel 599™, Nucrel 960™, Nucrel RX 76™, Nucrel 2806™, Bynell 2002, Bynell 2014, and Bynell 2020 (sold by E. I. du PONT)), the Aclyn family of toners (e.g. Aaclyn 201, Aclyn 246, Aclyn 285, and Aclyn 295), and the Lotader family of toners (e.g. Lotader 2210, Lotader, 3430, and Lotader 8200 (sold by Arkema)).

The polymer having ester side groups may constitute 1% or more by weight of the total amount of the polymers in the electrostatic ink composition and/or conductive trace, e.g. the total amount of the polymer or polymers having acidic side groups and polymer having ester side groups. The polymer having ester side groups may constitute 5% or more by weight of the total amount of the polymers in the electrostatic ink composition and/or conductive trace, in some examples 8% or more by weight of the total amount of the polymers in the electrostatic ink composition and/or conductive trace, in some examples 10% or more by weight of the total amount of the polymers in the electrostatic ink composition and/or conductive trace, in some examples 15% or more by weight of the total amount of the polymers in the electrostatic ink composition and/or conductive trace, in some examples 20% or more by weight of the total amount of the polymers in the electrostatic ink composition and/or conductive trace, in some examples 25% or more by weight of the total amount of the polymers in the electrostatic ink composition and/or conductive trace, in some examples 30% or more by weight of the total amount of the polymers in the electrostatic ink composition and/or conductive trace, in some examples 35% or more by weight of the total amount of the polymers in the electrostatic ink composition and/or conductive trace. The polymer having ester side groups may constitute from 5% to 50% by weight of the total amount of the polymers in the electrostatic ink composition and/or conductive trace, in some examples 10% to 40% by weight of the total amount of the polymers in the electrostatic ink composition and/or conductive trace, in some examples 15% to 30% by weight of the total amount of the polymers in the electrostatic ink composition and/or conductive trace.

The resin can constitute about 5 to 90%, in some examples about 50 to 80%, by weight of the solids of the electrostatic ink composition and/or conductive trace. The resin can constitute about 60 to 95%, in some examples about 70 to 95%, by weight of the solids of the electrostatic ink composition and/or conductive trace.

The electrostatic ink composition and/or conductive trace can comprise a charge director. A charge director can be added to an electrostatic ink composition to impart a charge of a desired polarity and/or maintain sufficient electrostatic charge on the resin particles of an electrostatic ink composition. The charge director may comprise ionic compounds, particularly metal salts of fatty acids, metal salts of sulfosuccinates, metal salts of oxyphosphates, metal salts of alkyl-benzenesulfonic acid, metal salts of aromatic carboxylic acids or sulfonic acids, as well as zwitterionic and non-ionic compounds, such as polyoxyethylated alkylamines, lecithin, polyvinylpyrrolidone, organic acid esters of polyvalent alcohols, etc. The charge director can be selected from, but is not limited to, oil-soluble petroleum sulfonates (e.g. neutral Calcium Petronate™, neutral Barium Petronate™, and basic Barium Petronate™), polybutylene succinimides (e.g. OLOA™ 1200 and Amoco 575), and glyceride salts (e.g. sodium salts of phosphated mono- and diglycerides with unsaturated and saturated acid substituents), sulfonic acid salts including, but not limited to, barium, sodium, calcium, and aluminum salts of sulfonic acid. The sulfonic acids may include, but are not limited to, alkyl sulfonic acids, aryl sulfonic acids, and sulfonic acids of alkyl succinates (e.g. see WO 2007/130069). The charge director can impart a negative charge or a positive charge on the resin-containing particles of an electrostatic ink composition.

The charge director can comprise a sulfosuccinate moiety of the general formula $[R_1—O—C(O)CH_2CH(SO_3^-)C(O)—O—R_2]$, where each of $R_1$ and $R_2$ is an alkyl group. In some examples, the charge director comprises nanoparticles of a simple salt and a sulfosuccinate salt of the general formula $MA_n$, wherein M is a metal, n is the valence of M, and A is an ion of the general formula $[R_1—O—C(O)CH_2CH(SO_3^-)C(O)—O—R_2]$, where each of $R_1$ and $R_2$ is an alkyl group, or other charge directors as found in WO2007130069, which is incorporation herein by reference in its entirety. As described in WO2007130069, the sulfosuccinate salt of the general formula $MA_n$, is an example of a micelle forming salt. The charge director may be substantially free or free of an acid of the general formula HA, where A is as described above. The charge director may comprise micelles of said sulfosuccinate salt enclosing at least some of the nanoparticles. The charge director may comprise at least some nanoparticles having a size of 200 nm or less, in some examples 2 nm or more. As described in WO2007130069, simple salts are salts that do not form micelles by themselves, although they may form a core for micelles with a micelle forming salt. The ions constructing the simple salts are all hydrophilic. The simple salt may comprise a cation selected from the group consisting of Mg, Ca, Ba, $NH_4$, tert-butyl ammonium, $Li^+$, and $Al^{+3}$, or from any sub-group thereof. The simple salt may comprise an anion selected from the group consisting of $SO_4^{2-}$, $PO^{3-}$, $NO_3^-$, $HPO_4^{2-}$, $CO_3^{2-}$, acetate, trifluoroacetate (TFA), $Cl^-$, $Bf$, $F^-$, $ClO_4^-$, and $TiO_3^{4-}$, or from any sub-group thereof. The simple salt may be selected from $CaCO_3$, $Ba_2TiO_3$, $Al_2(SO_4)$, $Al(NO_3)_3$, $Ca_3(PO_4)_2$, $BaSO_4$, $BaHPO_4$, $Ba_2(PO_4)_3$, $CaSO_4$, $(NH_4)_2CO_3$, $(NH_4)_2SO_4$, $NH_4OAc$, Tert-butyl ammonium bromide, $NH_4NO_3$, LiTFA, $Al_2(SO_4)_3$, $LiClO_4$ and $LiBF_4$, or any sub-group thereof. The charge director may further comprise basic barium petronate (BBP).

In the formula $[R_1—O—C(O)CH_2CH(SO_3^-)C(O)—O—R_2]$, in some examples, each of $R_1$ and $R_2$ is an aliphatic alkyl group. In some examples, each of $R_1$ and $R_2$ independently is a $C_{6-25}$ alkyl. In some examples, said aliphatic alkyl group is linear. In some examples, said aliphatic alkyl group is branched. In some examples, said aliphatic alkyl group includes a linear chain of more than 6 carbon atoms. In some examples, $R_1$ and $R_2$ are the same. In some examples, at least one of $R_1$ and $R_2$ is $C_{13}H_{27}$. In some examples, M is Na, K, Cs, Ca, or Ba. The formula $[R_1—O—C(O)CH_2CH(SO_3^-)C(O)—O—R_2]$ and/or the formula $MA_n$, may be as defined in any part of WO2007130069.

The charge director may comprise (i) soya lecithin, (ii) a barium sulfonate salt, such as basic barium petronate (BPP), and (iii) an isopropyl amine sulfonate salt. Basic barium petronate is a barium sulfonate salt of a 21-26 hydrocarbon alkyl, and can be obtained, for example, from Chemtura. An example isopropyl amine sulphonate salt is dodecyl benzene sulfonic acid isopropyl amine, which is available from Croda.

The charge director can constitute about 0.001% to 20%, in some examples 0.01 to 20% by weight, in some examples 0.01 to 10% by weight, in some examples 0.01 to 1% by weight of the solids of the electrostatic ink composition and/or conductive trace. The charge director can constitute about 0.001 to 0.15% by weight of the solids of the electrostatic ink composition and/or conductive trace, in some examples 0.001 to 0.15%, in some examples 0.001 to 0.02% by weight of the solids of the electrostatic ink composition and/or conductive trace. In some examples, the charge director imparts a negative charge on the electrostatic ink composition. The particle conductivity may range from 50 to 500 pmho/cm, in some examples from 200-350 pmho/cm.

The electrostatic ink composition and/or conductive trace can include a charge adjuvant. A charge adjuvant may be present with a charge director, and may be different to the charge director, and act to increase and/or stabilise the charge on particles, e.g. resin-containing particles, of an electrostatic ink composition. The charge adjuvant can include, but is not limited to, barium petronate, calcium petronate, Co salts of naphthenic acid, Ca salts of naphthenic acid, Cu salts of naphthenic acid, Mn salts of naphthenic acid, Ni salts of naphthenic acid, Zn salts of naphthenic acid, Fe salts of naphthenic acid, Ba salts of stearic acid, Co salts of stearic acid, Pb salts of stearic acid, Zn salts of stearic acid, Al salts of stearic acid, Cu salts of stearic acid, Fe salts of stearic acid, metal carboxylates (e.g. Al tristearate, Al octanoate, Li heptanoate, Fe stearate, Fe distearate, Ba stearate, Cr stearate, Mg octanoate, Ca stearate, Fe naphthenate, Zn naphthenate, Mn heptanoate, Zn heptanoate, Ba octanoate, Al octanoate, Co octanoate, Mn octanoate, and Zn octanoate), Co lineolates, Mn lineolates, Pb lineolates, Zn lineolates, Ca oleates, Co oleates, Zn palmirate, Ca resinates, Co resinates, Mn resinates, Pb resinates, Zn resinates, AB diblock co-polymers of 2-ethylhexyl methacrylate-co-methacrylic acid calcium, and ammonium salts, co-polymers of an alkyl acrylamidoglycolate alkyl ether (e.g. methyl acrylamidoglycolate methyl ether-co-vinyl acetate), and hydroxy bis(3,5-di-tert-butyl salicylic) aluminate monohydrate. In some examples, the charge adjuvant is aluminum di and/or tristearate and/or aluminum di and/or tripalmitate.

The charge adjuvant can constitute about 0.1 to 5% by weight of the solids of the electrostatic ink composition and/or conductive trace. The charge adjuvant can constitute about 0.5 to 4% by weight of the solids of the electrostatic ink composition and/or conductive trace. The charge adjuvant can constitute about 1 to 3% by weight of the solids of the electrostatic ink composition and/or conductive trace.

The electrostatic ink composition and/or conductive trace may further comprise a colorant. The colorant may be selected from a pigment, dye and a combination thereof. The colorant may be transparent, unicolor or composed of any combination of available colors. The colorant may be selected from a cyan colorant, a yellow colorant, a magenta colorant and a black colorant. The electrostatic ink composition and/or conductive trace may comprise a plurality of colorants. The electrostatic ink composition and/or conductive trace may comprise a first colorant and second colorant, which are different from one another. Further colorants may also be present with the first and second colorants. The electrostatic ink composition and/or conductive trace may comprise first and second colorants where each is independently selected from a cyan colorant, a yellow colorant, a magenta colorant and a black colorant. In some examples, the first colorant comprises a black colorant, and the second colorant comprises a non-black colorant, for example a colorant selected from a cyan colorant, a yellow colorant and a magenta colorant. The colorant may be selected from a phthalocyanine colorant, an indigold colorant, an indanthrone colorant, a monoazo colorant, a diazo colorant, inorganic salts and complexes, dioxazine colorant, perylene colorant, anthraquinone colorants, and any combination thereof.

In some examples, there is provided a method of manufacturing an electrostatic ink composition, the method comprising mixing a resin and an elongate conductive species. In some examples, the method involves mixing a resin and an elongate conductive species under shear conditions to produce particles comprising the resin and the elongate conductive species. "Particles comprising the resin and the elongate conductive species" as described herein, indicates that at least some, in some examples all, of the particles comprise both the resin and the elongate conductive species. The shear conditions may involve grinding the resin and the elongate conductive species, e.g. in a ball mill or a grinder, which may be in the presence of a carrier liquid.

In some examples, the method of manufacturing may comprise mixing the resin, the elongate conductive species and a carrier liquid under appropriate conditions, to form particles comprising the resin and the elongate conductive species that are suspended within the carrier liquid, and, in some examples, mixing a charge director with the carrier liquid. One or more further additives as described herein may be added at any time during the method. The steps described above are not intended to be bound by any particular order. For example, the mixing of the resin with the carrier liquid may be performed before, after, or concurrently with the step of combining the charge director with the carrier liquid. Additionally, the steps may be combined or performed in a different order. Additionally, the steps may include other processing steps. In some examples, the step of combining the elongate conductive species with the resin can include grinding the resin and the elongate conductive species, which may form particles comprising the resin and the elongate conductive species.

In some examples, there is provided a method of electrophotographic printing an electrostatic ink composition, wherein the electrostatic ink composition comprises particles comprising a resin and an elongate conductive species, and the method comprises:
 forming a latent electrostatic image on a surface;
 contacting the surface with the electrostatic ink composition, such that at least some of the particles adhere to the surface to form a developed toner image on the surface, and transferring the toner image to a substrate.

In some examples, there is provided a method of printing comprising:
 providing an electrostatic image; and
 developing the electrostatic image with the electrostatic ink composition comprising a resin and an elongate conductive species, which may be as described herein. Further, this method can additionally comprise transferring the developed image from a surface on which it is developed to a final substrate. Transferring the developed image can comprise first transferring the image to an intermediate transfer member and then transferring the image therefrom to the final substrate.

In some examples, the surface on which the (latent) electrostatic image is formed or developed may be on a rotating member, e.g. in the form of a cylinder. The surface on which the (latent) electrostatic image is formed or developed may form part of a photo imaging plate (PIP). The method may involve passing the electrostatic ink composition of the invention between a stationary electrode and a rotating member, which may be a member having the surface having the (latent) electrostatic image thereon or a member in contact with the surface having the (latent) electrostatic image thereon. A voltage is applied between the stationary electrode and the rotating member, such that particles, e.g. comprising the resin and elongate conductive species, adhere to the surface of the rotating member.

The intermediate transfer member, if present, may be a rotating flexible member, which may be heated, e.g. to a temperature of from 80 to 160° C. The print or final substrate may be any suitable substrate. The substrate may be any suitable substrate capable of having an image printed thereon. The substrate may have a conductivity less than the trace printed thereon. The substrate may comprise an electrically insulating material. The substrate may comprise a semiconducting material. The substrate may comprise a material selected from an organic or inorganic material. The material may comprise a natural polymeric material, e.g. cellulose. The material may comprise a synthetic polymeric material, e.g. a polymer formed from alkylene monomers, including, but not limited to, polyethylene and polypropylene, and co-polymers such as styrene-polybutadiene. The material may comprise a metal, which may be in sheet form. The metal may be selected from or made from, for instance, aluminum (Al), silver (Ag), tin (Sn), copper (Cu), mixtures thereof. In some examples, the substrate comprises a cellulosic paper. In some examples, the cellulosic paper is coated with a polymeric material, e.g. a polymer formed from styrene-butadiene resin. In some examples, the cellulosic paper has an inorganic material bound to its surface (before printing with ink) with a polymeric material, wherein the inorganic material may be selected from, for example, kaolinite or calcium carbonate. The substrate is in some examples a cellulosic print substrate such as paper. The cellulosic print substrate is in some examples a coated cellulosic print substrate, e.g. having a coating of a polymeric material thereon.

FIG. 1 shows a schematic illustration of an example of a method to create a conductive trace using an examples of Liquid Electrophotographic Printing (LEP). It illustrates a possible mechanism of alignment of the conductive elongate species. Step 101 shows an electrostatic ink composition comprising randomly-dispersed elongate conductive species (100B) within resin particles (100A) and a carrier liquid (not shown for simplicity), which has been transferred onto the surface of a developer, such as a PIP. These resin particles 100A containing the conductive species 100B may then be transferred (Step 102) to an intermediate transfer member (e.g. a blanket), which heats (Δ) the composition, causing the carrier liquid to evaporate and the resin particles to fuse together (Step 103). Once the carrier liquid has substantially evaporated, then the electrostatic ink particles are substantially fused together (Step 104). While the electrostatic ink particles are fusing, the elongate conductive species align with each other to give percolated conductive lines (Step 105).

EXAMPLES

The following illustrates examples of the methods and compositions described herein. Thus, these examples should not be considered as limitations of the present disclosure, but are merely in place to teach how to make examples of compositions of the present disclosure. As such, a representative number of compositions and their method of manufacture are disclosed herein.

The preliminary resin tested in the formulation was AC-575 (Honeywell®) which soft and brittle (this was found to produce good pigment compounding in grinding).

Described below is the preparation process of 20% particle loading (PL) carbon nanotubes ink with the AC-575 resin:

The following materials were weighed out on analytic scales:
- 0.9 gr of VCA (an aluminium di- and tri-stearate, and palmitate salt) (2.5 wt % of the solids (% NVS)
- 7.4 gr of carbon nanotubes (CNT) [MWCNTs 95 wt % from Cheap Tubes Company 8-15 nm OD, Outer Diameter: 8-15 nm, Inside Diameter: 3-5 nm, Length: 0.5-2.0 um (20 wt % of the solids)
- 69.7 gr of Honeywell's AC-575 resin (77.5 wt % of the solids)
- 122 gr of Isopar (compliment to 200 gr)

First, the attritor was set running at a moderately speed, which was less than 600 RPM. The attritor used was an attritor S0, available from Union Process. Second, the attritor's temperature was set to 30° C. Third, materials were inserted into the attritor in the following order:
1. AC-575
2. VCA
3. Carbon Nanotubes
4. Isopar Fourth, covering the atrittor and start grinding at maximum speed (600 RPM) for 3 hours. Followed by changing the temperature from 30° C. to 60° C. for another 3 hours and then pouring the ink into a suitable vessel.

Total grinding time—6 h.

The electrostatic ink composition produced in accordance with the above method will be termed electrostatic ink composition A.

A Procedure for the Measurement of Indigo Electroink Conductivity

Introduction:

The Q/M Indigo conductivity cell for the measurement of electrophoretic conductivity of charged ink particles includes: a high voltage supplier (up to 3 kV), a base and counter electrodes and A/D card operated by a Labview software.

The electrodes include a grounded stainless steel electrode with a diameter of 50 mm and a heavy mass body for a high thermal and electrical capacity. This electrode is denoted as "Upper electrode". The second electrode is a base with an internal diameter of 40 mm and a width of 1 mm insulated by a ceramic material. The electrode is subjected to a positive or negative potential up to 3 kV. This electrode will be denoted as "base electrode". The high voltage supplier maintains also a current restriction element to obtain a wanted electric field.

The applied field pulse is operated by using an ND card PCI 1200 manufactured by National Instruments and Labview software (also made by NI) that display, operate and analyzes the A/D signal. In a permanent or temporary conditions the applied pulse is defined by: applied voltage, pulse duration, reading frequency, averaging and integrating module that display the current collected curve as function of time. From that curve the high field conductivity is depicted from the integrated current around the obtained peak upon a defined threshold from baseline. The integrated current of curve baseline defines the direct current conductivity is subjected to electronic charges that through the liquid media composed from low dielectric oil, charge director micelles, dissolved resin, pigment and other functional groups.

Low Field Conductivity (LFC) meter developed in HP-Indigo includes 2 electrodes spaced apart by 1.5 mm distance and applied to which is an AC voltage of 10v (in case of a quadratic wave) or 15v (in case of sinusoidal wave) at 6 Hz frequency. The scale shows a range between 0-200 picoSimens where it has calibrating cap at 90 Ps and the scale is calibrated is upon using a screw.

The difference between HFC and LFC estimates the ink particle conductivity, HFC−LFC=PC, at small ink density up to 2-3% NVS.

Procedure:

The cell was approved to estimate conductivity for a 1-3 wt % solids concentration ink dispersions. When using a higher ink density, one may need to reduce cell amplification in order to be in linear dynamic range of the device.

Thus, before using the cell, the present inventors verified that it was calibrated to give a conductivity value in a linear dynamic range measurement. They used a known program with specified parameters or otherwise they could insert these parameters in a variable program. The parameters included: applied voltage (1500 V), applied electric field (1.5±0.07 V/μm), pulse duration (8 sec), sampling rate (1000 Hz), and cell depth (1000±50 μm). Other parameters regarding the integration around the peak, base line and other arithmetic actions are defined in the buildup of the Lab view program.

Measurements Steps:
1. Clean the electrodes (can be with low dielectric oil or high evaporative organic solvent).
2. Inject the ink dispersion to the base electrode to completely fill up of the cell.
3. Put the upper electrode so that it cover the base electrode.
4. Close the cell cover.
5. Press the operating arrow in left top corner.
6. Open the cell cover only when the pulse is finished.
7. In the display you may find the integrated conductivity current marked as HFC, dc, Total HFC and Total dc.
8. The LFC is obtained when inserting the LFC meter rod into stabilized ink dispersion (where ink solid still have not sediment) and read LFC at stabilized value.

Terms:

High field conductivity (HFC)—is measured in Siemens unit where the for ink dispersion made of oily non polar solvent charged by soap charge directing agents is in the picoSiemens level. This term defines the current collected under the application of a high electric field where charged/ionized electroink particles and charged/ionized species embedded in the liquid phase are developed in electrophoretic way. Since the cell voltage is kept, any little change in the voltage due to charge collection is recorded.

Low field conductivity (LFC)—is measured in Siemens unit where the for ink dispersion made of oily non polar solvent charged by soap charge directing agents is in the picoSiemens level. This term refer to the charged/ionized species that can be developed under low electric field and thus represents mainly the charged/ionized species exist in the liquid phase.

Direct current (dc)—refers to the charge collected under an electric field application where the charge is an electronic charge that is passes through the low dielectric media added by other molecules that enhances the media dielectric and increase electronic charge conductance. This parameter is also measured in picoSiemens unit.

Total HFC—reflects the total charge collected above the defined base line and includes also low mobility charged particles arrived at longer times.

Total dc—reflects the total electronic charge collected through the entire pulse.

Figure 2:
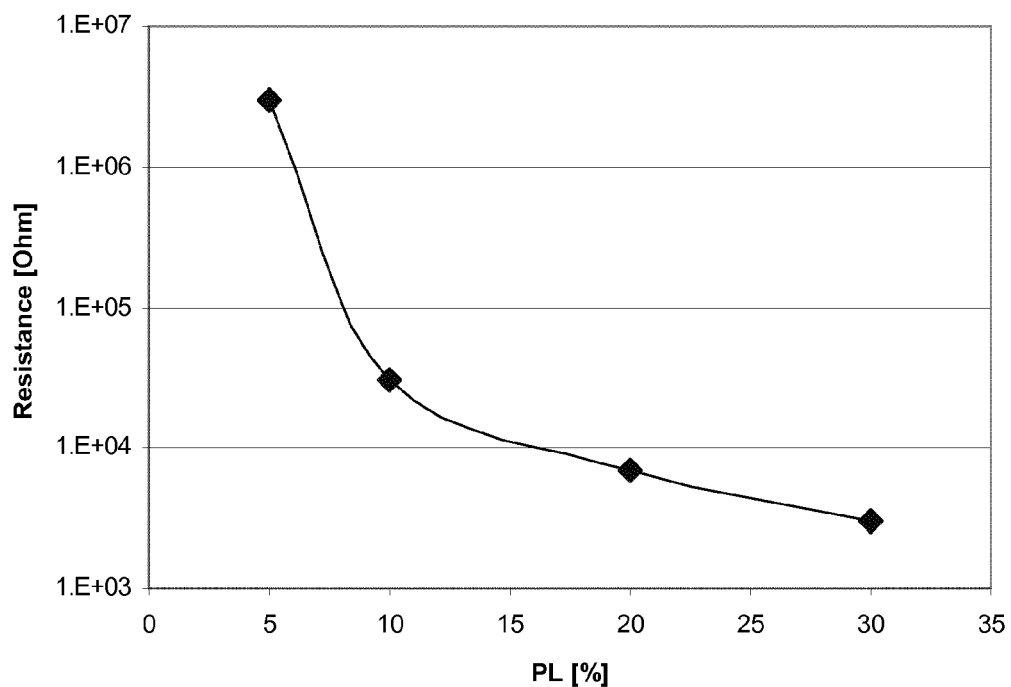
FIG. 2 shows results of an experiment described in the Examples below. In particular, it shows film conductivity from electroplating with different level of carbon nanotubes in the solids at 0.5 DMA (0.5 DMA simulates 5 separations of ink printed on a printing press). The graph shows resistance in Ohms against % particle loading [PL], i.e. the weight percentage of particles in the dry film.

The present inventors found that ink composition A was very not stable in charging and gave spikes in Q/M. The development in Q/M can be with two conductive electrodes to measure charging of the El, as described above. It also serves as offline electroplating device that collects the developed solids on a test substrate (e.g. paper). The developed ink layer is then dried or sintered in several possible ways, such as air and heat drying. Preliminary work on pigment loading with carried on this formulation including conductivity of plated film made with the Q/M with percolation trending to below 10 wt % PL (i.e. 10 wt % of carbon nanotube in the solids content of the printed conductive trace). In other words, when the carbon nanotubes constitute 10 wt % or above of the solids content of the ink, which will translate into 10 wt % or above of the printed dry ink, the conductivity is found to be reasonably high. The results are shown in FIG. 2, which shows film conductivity from electroplating with different level of CNT in the solids at 0.5 DMA (0.5 DMA simulates 5 separations of ink printed in on a printing press). The substrate was coated paper—Euro art.

The next trials were conducted using different formulations, as AC575 resin, on its own, composite gave an electrostatic ink composition that was not so stable in terms of maintaining a charge on the particles.

Two further electrostatic ink compositions were produced. The first included a resin combination of Nucrel 699, Nucrel 960 and Honeywell's A-C 5180. This electrostatic ink composition was produced as follows, and will be termed electrostatic ink composition B:

First, 650 grams of polyethylene-methacrylic acid copolymer (NUCREL® 960, Dupont), 140 grams of polyethylene-acrylic acid copolymer (A-C® 5180, Honeywell) and 140 grams of polyethylene-methacrylic acid copolymer (NUCREL® 699, DuPont) are mixed in a Ross double planetary mixer with 1750 grams of ISOPAR® L (an isoparafinic oil manufactured by Exxon) carrier liquid at a speed of 60 rpm and a temperature of 130° C. for one hour. The temperature is then reduced and mixing is continued until the mixture reaches room temperature. During mixing, the polymers solvate in Isopar, and during cooling, granules of polymer mixture (with solvated carrier liquid) in carrier liquid are produced. The resultant resin can then be used to produce an electrostatic ink composition in the same manner as electrostatic ink composition A described above (with the total amount of resin, and the amounts of all other components, being the same). As in electrostatic composition A, electrostatic ink B composition included carbon nanotubes in an amount of 20 wt % solids (7.2 g).

The second further electrostatic ink composition included a resin combination of Nucrel 699, NUCREL® 960, Honeywell's A-C 5180 and Honeywell's A-C 575. The relative proportions (by weight) of the resins were, in terms of (combination of NUCREL® 960, Nucrel 699 and Honeywell's A-C 5180): Honeywell's A-C 575-2:1. This electrostatic ink composition was produced as follows, and will be termed electrostatic ink composition C:

The mixture resin was produced in the same way as the electrostatic ink composition B, with the total amount of resins being the same, but this time including the AC-575 resin in the relative amount mentioned above. As in electrostatic composition A, electrostatic ink C composition included carbon nanotubes in an amount of 20 wt % solids (7.2 g).

The present inventors found that Nucrel 699/NUCREL® 960/Honeywell's A-C 5180 combination of resins gave a stable ink with addition of AC575 (i.e. electrostatic ink composition C) and it seemed to have a satisfactory balance of properties, in terms of charging stability, coating of the carbon nanotubes, printing properties and conductivity in the printed ink. Nucrel 699/NUCREL® 960/Honeywell's A-C 5180 combination alone did not seem to coat the carbon nanotubes as effectively, as determined from SEM analysis. Overall, electrostatic ink composition A (20% PL) was found to coat the carbon nanotubes well, but had low charging stability. Electrostatic ink composition B (20% PL) was not so effective in coating the carbon nanotubes as A, but had good charging stability. Electrostatic ink composition C (20% PL) was found to coat the carbon nanotubes well, and had good charging stability.

Figure 3:
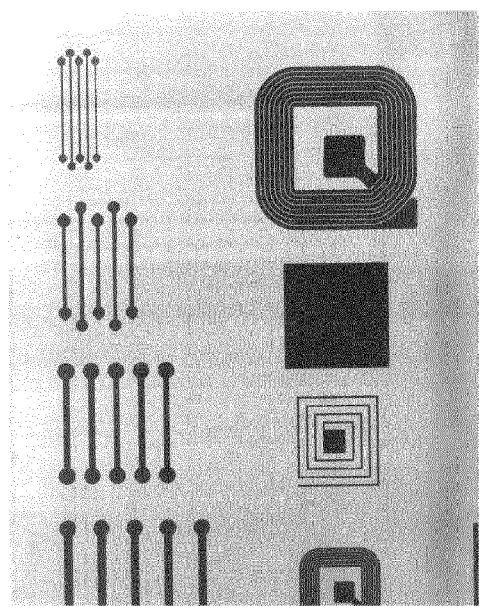
FIG. 3 shows a sample trace which has been electrostatically printed trace on a substrate using an example electrostatic ink composition according to Formulation C, which is described in the Examples below.

The printing results with electrostatic ink composition C are presented in FIG. 3 The conductive traces gave resistance of about 15 KOhm with 4 separations (layers) and after heat treatment (250° C. in the oven or with a blower).

While the compositions, methods and related aspects have been described with reference to certain examples, those skilled in the art will appreciate that various modifications, changes, omissions, and substitutions can be made without departing from the spirit of the disclosure. It is intended, therefore, that the compositions, methods and related aspects be limited only by the scope of the following claims. The features of any dependent claim may be combined with the features of any of the independent claims or other dependent claims.

The invention claimed is:

1. An electrostatic ink composition comprising:
   chargeable particles comprising a resin and an elongate conductive species, wherein the resin comprises:
      a combination of a first co-polymer, a second co-polymer, and a third co-polymer, each of the first co-polymer, the second co-polymer, and the third co-polymer being independently selected from the group consisting of a co-polymer of an alkylene monomer and a methacrylic acid monomer and a co-polymer of an alkylene monomer and an acrylic acid monomer, and the first co-polymer having a first melt viscosity of more than 60,000 poise, the second co-polymer having a second melt viscosity ranging from 15,000 poise to 40,000 poise, and the third co-polymer having a melt viscosity of 15,000 poise or less; and a fourth co-polymer of an alkylene monomer and a maleic anhydride;

wherein a weight ratio of the combination of the first co-polymer, the second co-polymer, and the third co-polymer to the fourth co-polymer of the alkylene monomer and the maleic anhydride ranges from 10:1 to 1:10.

2. The electrostatic ink composition of claim 1, wherein the elongate conductive species comprises a species selected from carbon black, graphene and metals.

3. The electrostatic ink composition of claim 1, wherein the elongate conductive species comprises or is carbon nanotubes.

4. The electrostatic ink composition of claim 1, wherein the chargeable particles are dispersed in a carrier liquid.

5. The electrostatic ink composition of claim 1, wherein the electrostatic ink composition comprises a charge director.

6. The electrostatic ink composition of claim 1, wherein each of the first co-polymer, the second co-polymer and the third co-polymer has a hardness, as measured at 25° C. using ASTM D2240, that is more than a hardness of the fourth co-polymer of the alkylene monomer and maleic anhydride.

7. The electrostatic ink composition of claim 1, wherein the resin partially or completely encapsulates the elongate conductive species.

8. The electrostatic ink composition of claim 5, wherein the charge director is selected from the group consisting of metal salts of sulfo-succinates, metal salts of oxyphosphates, metal salts of alkyl-benzenesulfonic acid, metal salts of aromatic carboxylic acids, metal salts of sulfonic acids, lecithin, polyvinylpyrrolidone, oil-soluble petroleum sulfonates, polybutylene succinimides, glyceride salts, and sulfonic acid salts.

9. The electrostatic ink composition of claim 1, wherein:
the first co-polymer is a polyethylene-methacrylic acid co-polymer;
the second co-polymer is a polyethylene-methacrylic acid co-polymer; and
the third co-polymer is a polyethylene-acrylic acid co-polymer.

10. The electrostatic ink composition of claim 9, wherein the fourth co-polymer of the alkylene monomer and the maleic anhydride is an ethylene maleic anhydride co-polymer.

11. The electrostatic ink composition of claim 10, wherein the weight ratio of the combination of the first co-polymer, the second co-polymer, and the third co-polymer to the fourth co-polymer of the alkylene monomer and the maleic anhydride is 2:1.

12. The electrostatic ink composition of claim 1, wherein a weight ratio of the first co-polymer to the second co-polymer to the third co-polymer is 65:14:14.

13. A substrate on which is electrostatically printed a conductive trace, wherein the trace comprises chargeable particles comprising a resin and an elongate conductive species, wherein the resin comprises:
a combination of a first co-polymer, a second co-polymer, and a third co-polymer, each of the first co-polymer, the second co-polymer, and the third co-polymer being independently selected from the group consisting of a co-polymer of an alkylene monomer and a methacrylic acid monomer and a co-polymer of an alkylene monomer and an acrylic acid monomer, and the first co-polymer having a first melt viscosity of more than 60,000 poise, the second co-polymer having a second melt viscosity ranging from 15,000 poise to 40,000 poise, and the third co-polymer having a melt viscosity of 15,000 poise or less; and
a fourth co-polymer of an alkylene monomer and a maleic anhydride;
wherein a weight ratio of the combination of the first co-polymer, the second co-polymer, and the third co-polymer to the fourth co-polymer of the alkylene monomer and the maleic anhydride ranges from 10:1 to 1:10.

14. The substrate of claim 13, wherein the elongate conductive species comprises carbon nanotubes.

15. A method of electrophotographic printing an electrostatic ink composition, wherein the electrostatic ink composition comprises chargeable particles comprising a resin and an elongate conductive species, the resin comprising:
a combination of a first co-polymer, a second co-polymer, and a third co-polymer, each of the first co-polymer, the second co-polymer, and the third co-polymer being independently selected from the group consisting of a co-polymer of an alkylene monomer and a methacrylic acid monomer and a co-polymer of an alkylene monomer and an acrylic acid monomer, and the first co-polymer having a first melt viscosity of more than 60,000 poise, the second co-polymer having a second melt viscosity ranging from 15,000 poise to 40,000 poise, and the third co-polymer having a melt viscosity of 15,000 poise or less; and
a fourth co-polymer of an alkylene monomer and a maleic anhydride;
wherein a weight ratio of the combination of the first co-polymer, the second co-polymer, and the third co-polymer to the fourth co-polymer of the alkylene monomer and the maleic anhydride ranges from 10:1 to 1:10; and
the method comprises:
forming a latent electrostatic image on a surface; and
contacting the surface with the electrostatic ink composition, such that at least some of the chargeable particles adhere to the surface to form a developed toner image on the surface, and transferring the toner image to a substrate.

* * * * *

UNITED STATES PATENT AND TRADEMARK OFFICE
CERTIFICATE OF CORRECTION

PATENT NO. : 9,899,124 B2  
APPLICATION NO. : 14/416453  
DATED : February 20, 2018  
INVENTOR(S) : Yaron Grinwald Page 1 of 1

It is certified that error appears in the above-identified patent and that said Letters Patent is hereby corrected as shown below:

On the Title Page

Item (75), Line 6, delete "Nes Ziona" and insert -- Ness Ziona --, therefor.

Signed and Sealed this  
Ninth Day of April, 2019

Andrei Iancu  
*Director of the United States Patent and Trademark Office*